(12) United States Patent
Inagaki

(10) Patent No.: US 10,251,274 B2
(45) Date of Patent: Apr. 2, 2019

(54) PRINTED CIRCUIT BOARD

(71) Applicant: CANON KABUSHIKI KAISHA, Tokyo (JP)

(72) Inventor: Yoshikazu Inagaki, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 218 days.

(21) Appl. No.: 14/895,925

(22) PCT Filed: Jun. 23, 2014

(86) PCT No.: PCT/JP2014/067293
§ 371 (c)(1),
(2) Date: Dec. 3, 2015

(87) PCT Pub. No.: WO2014/208763
PCT Pub. Date: Dec. 31, 2014

(65) Prior Publication Data
US 2016/0135300 A1 May 12, 2016

(30) Foreign Application Priority Data

Jun. 28, 2013 (JP) .................................. 2013-137013

(51) Int. Cl.
*H05K 7/00* (2006.01)
*H05K 1/18* (2006.01)
(Continued)

(52) U.S. Cl.
CPC .......... *H05K 1/181* (2013.01); *H05K 1/0216* (2013.01); *H05K 1/0298* (2013.01); *H05K 1/115* (2013.01); *H05K 1/0243* (2013.01); *H05K 1/16* (2013.01)

(58) Field of Classification Search
CPC .. H05K 1/0216; H05K 1/0243; H05K 1/0298; H05K 1/115; H05K 1/16; H05K 1/181
See application file for complete search history.

(56) References Cited

U.S. PATENT DOCUMENTS 7,164,898 B2 * 1/2007 Hankui ............... H04B 1/3833
455/311
8,994,470 B2 3/2015 Sakai
(Continued)

FOREIGN PATENT DOCUMENTS

JP H07-142871 A 6/1995
JP 2000-77852 A 3/2000
(Continued)

OTHER PUBLICATIONS

International Preliminary Report on Patentability dated Jan. 7, 2016 for Int'l Patent Appln No. PCT/JP2014/067293.
(Continued)

*Primary Examiner* — Yuriy Semenenko
(74) *Attorney, Agent, or Firm* — Venable LLP

(57) ABSTRACT

A printed circuit board has a printed wiring board and a semiconductor package mounted on the printed wiring board. The printed wiring board has a signal conductor pattern and a resonance portion resonating with a plurality of resonance frequencies. The resonance portion has a plurality of conductor patterns aligned while separated each other to oppose to the ground conductor pattern through an insulating layer. The plurality of conductor patterns are arranged so as to oppose to the ground conductor pattern which is connected to a ground terminal of the semiconductor package. The resonance portion has a connecting conductor connecting the conductor patterns adjacent to each other. The resonance portion has a via conductor connecting the conductor pattern with the signal conductor pattern. The printed circuit board can reduce an exclusive region of the resonance portion interrupting a plurality of harmonic components, and can reduce EMI originating in a digital signal.

12 Claims, 13 Drawing Sheets

(51) Int. Cl.
    *H05K 1/02*     (2006.01)
    *H05K 1/11*     (2006.01)
    *H05K 1/16*     (2006.01)

(56) References Cited

U.S. PATENT DOCUMENTS

| | | | |
|---|---|---|---|
| 9,225,049 B2 * | 12/2015 | Nakase | H01L 23/66 |
| 9,620,841 B2 * | 4/2017 | Tong | H01P 5/028 |
| 2014/0049343 A1 * | 2/2014 | Sakai | H05K 1/0225 |
| | | | 333/219 |
| 2014/0132371 A1 * | 5/2014 | Hankui | H01P 1/20345 |
| | | | 333/202 |

FOREIGN PATENT DOCUMENTS

| | | | |
|---|---|---|---|
| JP | 2001-127506 A | | 5/2001 |
| JP | 2006-314046 A | | 11/2006 |
| JP | 2012-38863 A | | 2/2012 |
| JP | WO 2012/147803 | * | 11/2012 |
| JP | WO 2012/176933 | * | 12/2012 |
| WO | 2012/147803 A1 | | 11/2012 |
| WO | 2012/176933 A1 | | 12/2012 |
| WO | 2012/176933 A1 | | 2/2015 |

OTHER PUBLICATIONS

Japanese Office Action dated Aug. 8, 2017 in Japanese Application No. 2013137013.

* cited by examiner

PRINTED CIRCUIT BOARD

TECHNICAL FIELD

The present invention relates to a printed circuit board which is provided with a semiconductor package that transmits a digital signal, and a printed wiring board that is used for the transmission of the digital signal.

BACKGROUND ART

In recent years, a digital copying machine and a digital camera need to transmit a digital signal having a large capacity at high speed, in order to achieve the enhancement of the speed and the resolution. When a high-speed digital signal transmits on a printed wiring board, an electromagnetic wave interference (EMI: Electro Magnetic Interference) occurs while a cable and the like which are connected to the printed wiring board work as an antenna, and may affect an operation of other electronic equipment. Because of this, it is necessary to reduce a radiation noise which originates in the high-speed digital signal.

It is known to use an LC resonance type filter as one reduction unit, which removes an unnecessary harmonic component in the digital signal, which causes the radiation noise. The LC resonance type filter uses a series resonance of an inductance and capacitance or a parallel resonance thereof, makes the resonance frequency of the filter coincide with the unnecessary harmonic component, thereby interrupts the unnecessary harmonic component of the digital signal, and suppresses the spread thereof.

In this LC resonance type filter, when the digital signal becomes to transmit at high speed, the unnecessary harmonic component also becomes a higher frequency, and accordingly the resonance frequency of the LC resonance circuit also needs to be set at high frequency. However, if it is intended to form the high-frequency resonance circuit out of a commercial component, the value of the component element becomes an extremely small value, and it becomes difficult to obtain a desired resonance frequency with a standard component.

For such a problem, a method has been known which forms the inductance and the capacitance by a wiring pattern on the printed wiring board and thereby obtains a desired resonance frequency. Japanese Patent Application Laid-Open No. H07-142871 describes a method of using an inductance which occurs in a slim wiring pattern and a via, and/or a capacitance which is formed in planar wiring patterns opposing to each other. The patent describes that a desired resonance frequency is obtained by designing a wiring pattern of the printed wiring board so as to have a shape from which desired inductance and capacitance are obtained.

However, there exist a plurality of unnecessary harmonic components which the digital signal has, and it has been necessary for the printed wiring board in Japanese Patent Application Laid-Open No. H07-142871 to prepare an LC type resonant filter that is formed of sheet wiring patterns for every harmonic component, each of which opposes to a via. In recent years, a miniaturization of a product progresses, and restrictions of arrangement, wiring and the like of a mounted component such as IC increase more and more. In such a situation, it has become a difficult situation to provide such a large area for measures against a radiation noise as to have a plurality of LC resonant filters aligned therein.

Thus, an object of the present invention is to reduce an exclusive region of a resonance portion which can interrupt a plurality of harmonic components, and to reduce EMI originating in a digital signal.

CITATION LIST

Patent Literature

PTL 1: Japanese Patent Application Laid-Open No. H07-142871

SUMMARY OF INVENTION

Solution to Problem

According to an aspect of the present invention, a printed circuit board comprises: a semiconductor package having a signal terminal for transmitting a digital signal and a ground terminal to which a ground voltage is applied; and a printed wiring board on which the semiconductor package is mounted, and which has a plurality of conductor layers stacked via an insulating layer, wherein the printed wiring board comprises a signal conductor pattern formed in a first conductor layer included in the plurality of conductor layers, and connected to the signal terminal of the semiconductor package, a ground conductor pattern formed in a second conductor layer different from the first conductor layer included in the plurality of conductor layers, and connected to the ground terminal of the semiconductor package, and a resonance portion resonating with at least two frequencies among resonance frequencies substantially equal to integral multiples of fundamental frequency of the digital signal transmitted through the signal conductor pattern, and wherein the resonance portion comprises a sheet signal wiring including a plurality of conductor patterns formed in a third conductor layer different from the first and second conductor layers included in the plurality of conductor layers and arranged in opposition to the ground conductor pattern via an insulating layer, and at least one connecting conductor connecting between adjacent ones of the plurality of conductor patterns, and a via conductor connecting the sheet signal wiring to the signal conductor pattern.

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

First Embodiment

Figure 1:
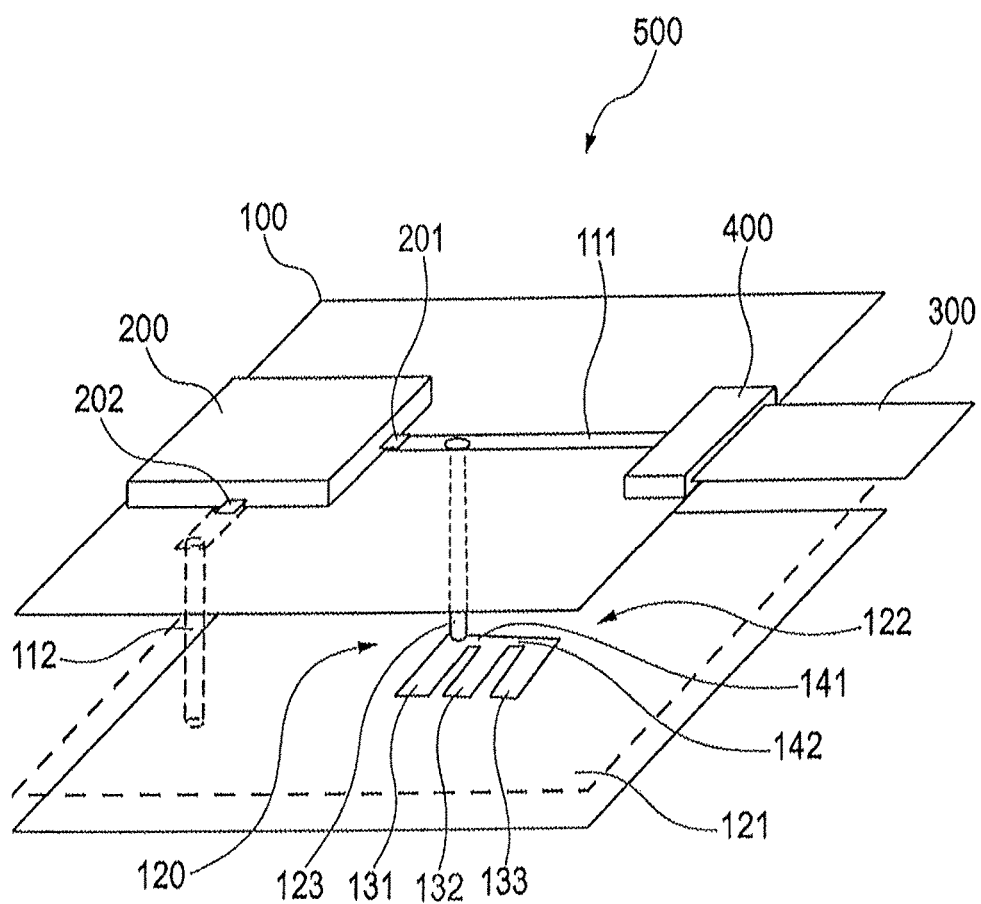
FIG. 1 is an explanatory view illustrating a schematic configuration of a printed circuit board according to a first embodiment.
Figure 2:
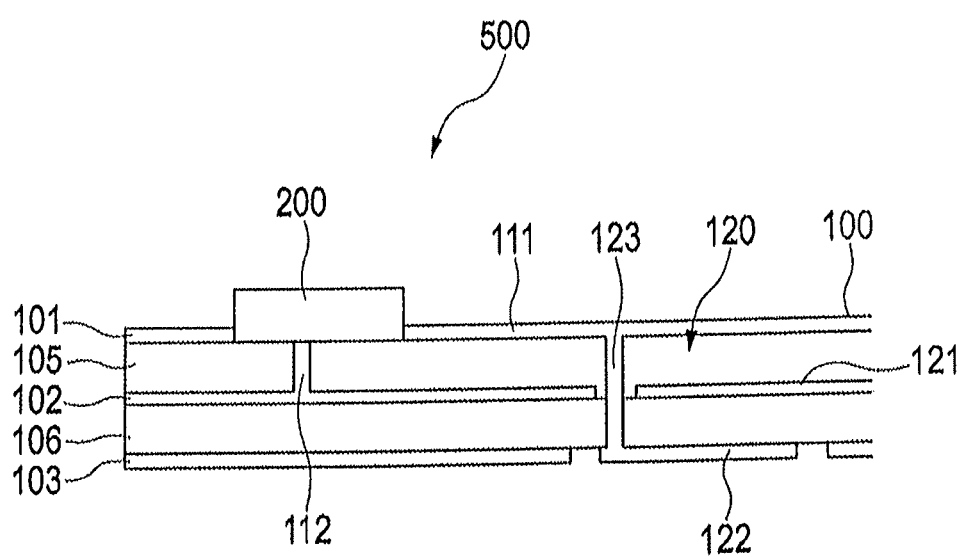
FIG. 2 is a sectional view illustrating one part of the printed circuit board according to the first embodiment.

FIG. 1 is an explanatory view illustrating a schematic configuration of a printed circuit board according to a first embodiment of the present invention. FIG. 2 is a sectional view illustrating one part of the printed circuit board according to the first embodiment of the present invention. A printed circuit board 500 illustrated in FIG. 1 and FIG. 2 is mounted, for instance, on electronic equipment such as a copying machine, a printer, a facsimile, a digital complex machine of these machines, and a digital camera, and is used for the transmission of a digital signal for performing data communications.

The printed circuit board 500 is provided with a printed wiring board 100, a semiconductor package 200 which is mounted on the printed wiring board 100, and a connector 400 that is mounted on the printed wiring board 100 and to which a cable 300 is connected.

The semiconductor package 200 transmits a digital signal at a predetermined transmission rate [bps] by a differential transmission system, is formed of a semiconductor package, for instance, and has a signal terminal 201. In other words, the digital signal is transmitted from the signal terminal 201.

In the present first embodiment, in order to transmit a digital signal having a large capacity at high speed, a serial transmission system is used which can transmit data having a large capacity through few transmission lines at high speed. The serial transmission system is a method of serializing a low-speed parallel signal such as data, an address and a control line, outputting the serialized signal to the transmission line, and deserializing the transmitted serial signal to convert the deserialized signal into a parallel signal in a receiving side. A clock signal is embedded in the serialized data row, the data row is transmitted, and the clock and data are reproduced in the receiving side.

Incidentally, in the present first embodiment, the semiconductor package 200 outputs the digital signal by the differential transmission system, and accordingly the semiconductor package 200 has two signal terminals. However, only one signal terminal 201 among the two signal terminals is illustrated, and the illustration of the other signal terminal is omitted. In addition, the semiconductor package 200 has a not-illustrated power source terminal and a ground terminal 202. A power source potential is applied to the power source terminal, a ground potential is applied to the ground terminal 202, and the semiconductor package 200 is operated.

Figure 3:
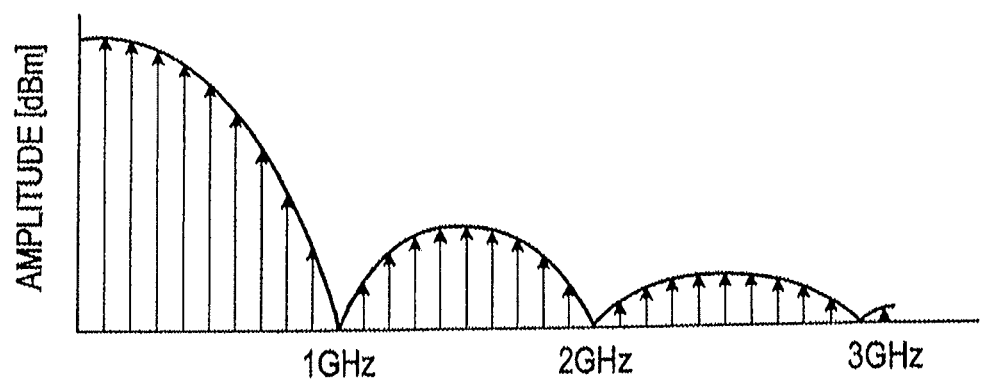
FIG. 3 is a graph illustrating a spectrum of a digital signal.

The frequency corresponding to the transmission rate of the digital signal is a fundamental frequency (repeat frequency) [Hz], and when the transmission rate of the digital signal is 1 [Gbps], for instance, the fundamental frequency of the digital signal is 1 [GHz]. In other words, the fundamental frequency is a frequency corresponding to a time cycle per one bit. In addition, the fundamental frequency of the digital signal can be measured according to a clock signal frequency which has been reproduced from the digital signal. FIG. 3 is a graph illustrating a spectrum of a digital signal. This digital signal of the serial transmission system is expressed by a sinc function, has a signal component in another frequency band than frequencies of integral multiples of the fundamental frequency, and has almost no signal component in frequencies of integral multiples of the fundamental frequency.

As is illustrated in FIG. 2, the printed wiring board 100 is a multilayer substrate in which a plurality of conductor layers 101 to 103 are stacked through insulating layers 105 and 106, and may have at least three conductor layers. In the present first embodiment, the printed wiring board 100 has three layers, for instance.

The printed wiring board 100 is formed on the conductor layer 101 of one surface layer, which is a first conductor layer included in the plurality of conductor layers 101 to 103, and has a signal conductor pattern 111 which is connected to the signal terminal 201 of the semiconductor package 200, as is illustrated in FIG. 1. This signal conductor pattern 111 is formed into a line shape, one end thereof is connected to the signal terminal 201 of the semiconductor package 200, and the other end thereof is connected to a terminal (not illustrated) of the connector 400. Thereby, the digital signal which is transmitted from the signal terminal 201 of the semiconductor package 200 propagates through the signal conductor pattern 111 and the cable 300, and is received by a not-illustrated receiving circuit. This receiving circuit is mounted on a not-illustrated printed wiring board different from the printed wiring board 100, other electronic equipment or the like.

In addition, the printed wiring board 100 has a resonance portion 120 which is branched from and is connected to the signal conductor pattern 111, and resonates in series with a plurality of resonance frequencies which are different from each other.

Here, in the digital signal which propagates through the signal conductor pattern 111, noises (common mode noise) having narrow bands which have peaks at frequencies of the integral multiples (once, twice, three times and so on) of the fundamental frequency, respectively, occasionally overlap the digital signal. Specifically, noises are generated which cannot be negated by a differential clock signal. In addition, as has been described above, there is almost no signal component in the frequencies of the integral multiples of the fundamental frequency of the digital signal. Accordingly, in the present first embodiment, the frequencies of the resonance portion 120 are set so that the resonance frequencies become the frequencies of the integral multiples (once, twice, and three times) of the fundamental frequency, respectively. Incidentally, the resonance portion 120 is connected to the signal conductor pattern 111, but a not-illustrated resonance portion having the same configuration as that of the resonance portion 120 may be connected also to a not-illustrated signal conductor pattern which is connected to another not-illustrated signal terminal of the semiconductor package 200.

The resonance portion 120 has a sheet signal wiring 122 which is formed on the conductor layer 103 that is the other surface layer which is a third conductor layer different from the conductor layer 101 and the conductor layer 102, and is formed of a conductor that opposes to a ground conductor pattern 121 through an insulating layer 106. The sheet signal wiring 122 is arranged so as to oppose to the ground conductor pattern 121 which is formed on the inner-layer conductor layer 102 that is a second conductor layer different from the conductor layer 101 included in the plurality of conductor layers 101 to 103. The ground conductor pattern 121 is connected to the ground terminal 202 of the semiconductor package 200 through a via conductor 112 and the like. Furthermore, the resonance portion 120 has a via conductor 123 which connects the sheet signal wiring 122 with the signal conductor pattern 111.

The ground conductor pattern 121 is formed so as to have such a size as to include the whole of a projected image formed when the sheet signal wiring 122 is projected onto the conductor layer 102 in a stacked direction of the conductor layers 101 to 103.

In the present first embodiment, an LC series resonant circuit (resonance portion 120) includes the sheet signal wiring 122, the ground conductor pattern 121 which opposes to the sheet signal wiring 122 (specifically, opposing portion to ground conductor pattern 121), and the via conductor 123.

When a capacitance formed by the sheet signal wiring 122 and the ground conductor pattern 121 is represented by C [F], and an inductance of the via conductor 123 is represented by L [H], the resonance frequency f of this resonance portion 120 is expressed by Expression 1.

[Math. 1]

$$f = \frac{1}{2\pi\sqrt{LC}} \quad (1)$$

In this resonance frequency, an impedance between the signal conductor pattern 111 and the ground conductor pattern 121 becomes small. Because of this, among the frequency components in the digital signal that is transmitted from the semiconductor package 200, a component which coincides with the resonance frequency of the resonance portion 120 is interrupted, the propagation of the component to the cable 300 is suppressed, and the radiation noise is reduced.

Figure 4A:
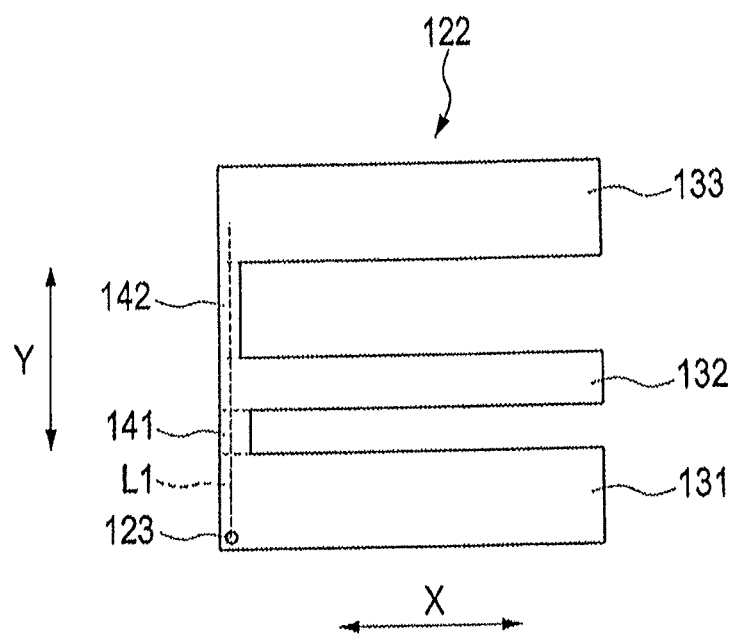
FIGS. 4A and 4B show explanatory views illustrating a sheet signal wiring of a printed wiring board in the printed circuit board according to the first embodiment.
Figure 4B:
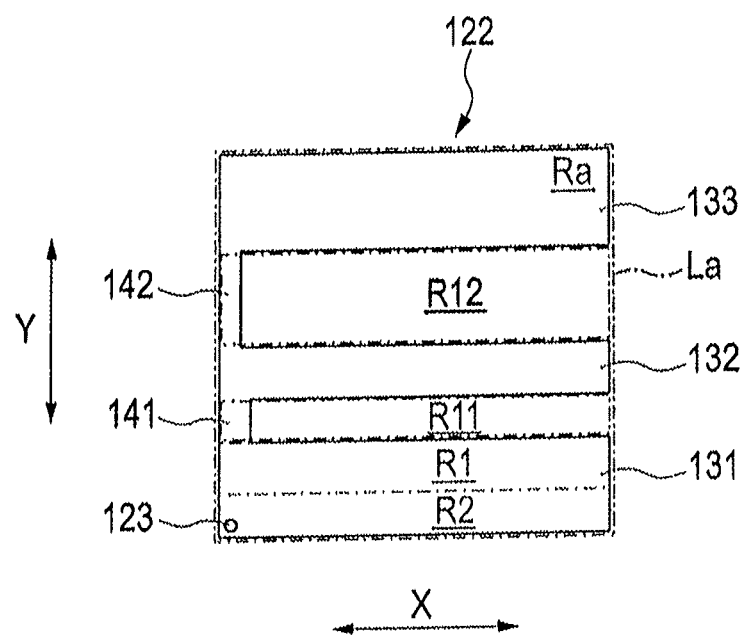

FIGS. 4A and 4B show an explanatory view illustrating the sheet signal wiring 122 in the printed wiring board 100 of the first embodiment in the present invention. FIG. 4A is a plan view of the sheet signal wiring 122; and FIG. 4B is a plan view for describing a configuration of the sheet signal wiring 122.

The sheet signal wiring 122 is configured so as to have a plurality (three) of conductor patterns 131, 132 and 133 which are aligned while being separated from each other, and connecting conductors 141 and 142 that connect the conductor patterns to each other, which are adjacent to each other. The conductor patterns 131, 132 and 133 are formed into a planer shape.

A shortest surrounding line La which surrounds the plurality of conductor patterns 131, 132 and 133 can be formed into a rectangle shape (which includes square shape). In addition, the conductor patterns 131, 132 and 133 can be each formed into a rectangle shape. The conductor patterns 131, 132 and 133 can be arranged along a width direction (direction of arrow Y) while being separated from each other, and can be formed so as to have the same length in a length direction (direction of arrow X) which is perpendicular to the width direction. The conductor patterns 131, 132 and 133 can be parallel to each other, in other words, can have the same length direction as each other. In addition, a direction in which the connecting conductors 141 and 142 extend can be a direction which crosses the length direction of the conductor patterns 131, 132 and 133, and can be a direction perpendicular (direction of arrow Y) to the length direction in particular. The width of each of the connecting conductors 141 and 142 in the direction of the arrow X is shorter than the length of the conductor patterns 131, 132 and 133 in the length direction (direction of arrow X).

The connecting conductors 141 and 142 are arranged on the same line. In the present first embodiment, the connecting conductors are arranged on a straight line which extends to the direction of the arrow Y (for instance, on dashed line L1 in FIG. 4A). In addition, the connecting conductors are arranged on one end of the conductor patterns 131, 132 and 133 in the direction of the arrow X.

In the present first embodiment, the conductor pattern 131 is determined to be a first conductor pattern, among the conductor patterns 131 and 133 which are positioned in the outside of the three conductor patterns 131, 132 and 133. In addition, the conductor pattern 132 which is adjacent to the conductor pattern 131 is determined to be a second conductor pattern. In addition, the conductor pattern 133 which is adjacent to the conductor pattern 132 is determined to be a third conductor pattern. The conductor pattern 132 is arranged between the conductor pattern 131 and the conductor pattern 133.

In order that the above described via conductor 123 connects the conductor pattern 131 with the signal conductor pattern 111, one end of the via conductor 123 is connected to the signal conductor pattern 111, and the other end is connected to the conductor pattern 131.

In the present first embodiment, the connecting conductors 141 and 142 are linear conductors (patterns) which are formed on the conductor layer 103 integrally with the conductor patterns 131, 132 and 133. Incidentally, the connecting conductors 141 and 142 may be formed by a not-illustrated via conductor and a not-illustrated conductor pattern which is formed on a conductor layer different from the conductor layer 103. Anyway, the connecting conductors 141 and 142 may be formed separately from the signal conductor pattern 111.

A surrounding area (size) S1 of a surrounding region Ra which is surrounded by the shortest surrounding line La that surrounds the plurality of conductor patterns 131, 132 and 133 is an area in which the resonance portion 120 resonates with a frequency derived by multiplying, by 1, the fundamental frequency of the digital signal. Specifically, the surrounding region Ra has a size with which the LC resonance circuit having the same resonance frequency as the first-order harmonic of the noise is formed from the capacitance that is produced by the conductor patterns 131 to 133 and the ground conductor pattern 121, which oppose to each other, and the inductance of the via conductor 123.

In the present first embodiment, an area of the conductor pattern 131 is substantially equal to ¼ of the surrounding area S1, an area of the conductor pattern 132 is substantially equal to 5/36 of the surrounding area S1, and an area of the conductor pattern 133 is substantially equal to ¼ of the surrounding area S1.

An area of a region (space) R11 in between the conductor pattern 131 and the conductor pattern 132 in the surrounding region Ra is substantially equal to ⅛ of the surrounding area S1. In addition, an area of a region (space) R12 in between the conductor pattern 132 and the conductor pattern 133 in the surrounding region Ra is substantially equal to ¼ of the surrounding area S1.

Figure 13:
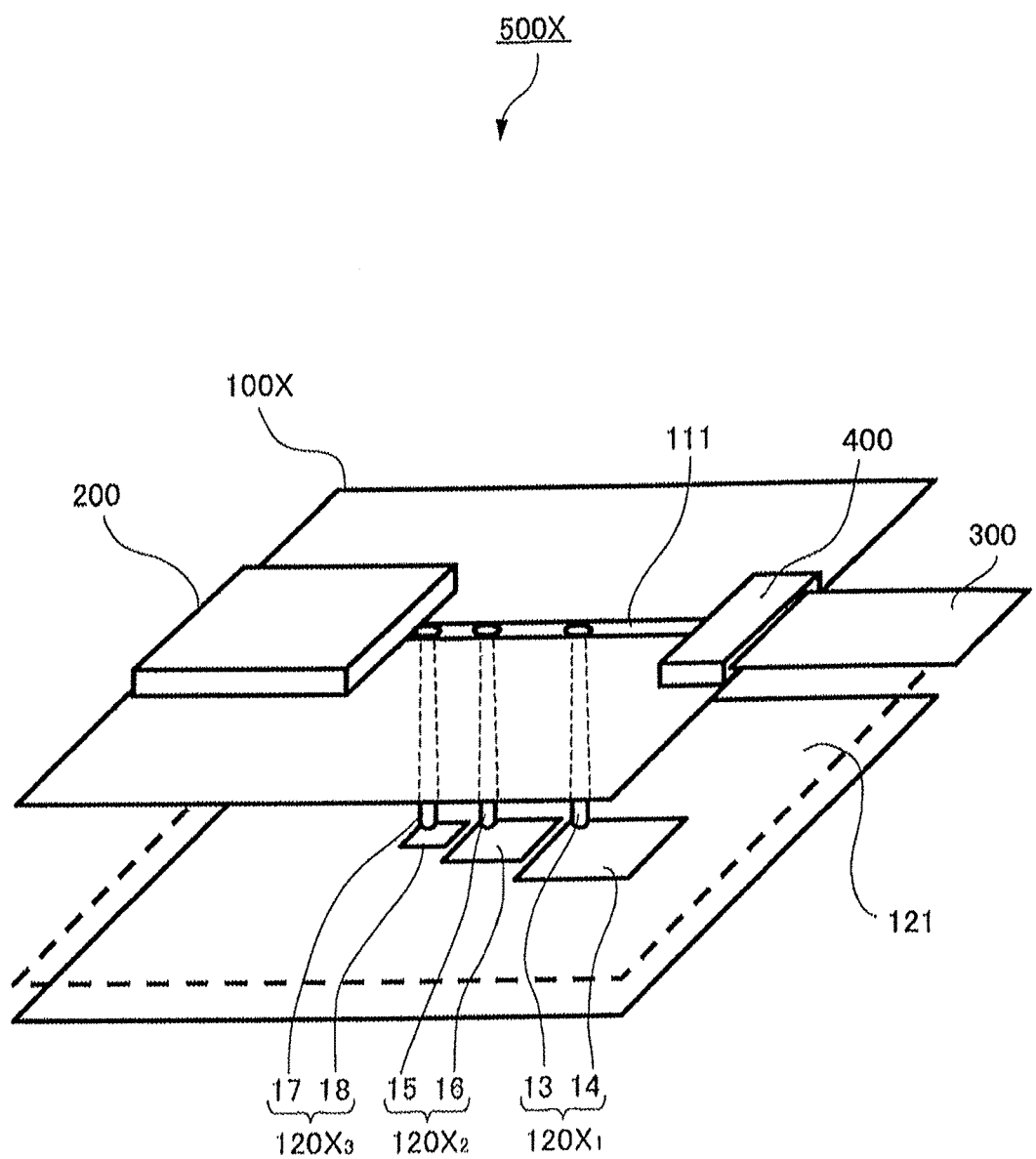
FIG. 13 is an explanatory view illustrating a schematic configuration of a printed circuit board according to a comparative example.

FIG. 13 is an explanatory view illustrating a schematic configuration of a printed circuit board according to a comparative example. A printed circuit board 500X of the comparative example is provided with a printed wiring board 100X, a semiconductor package 200 which is mounted on the printed wiring board 100X, and a connector 400 to which a cable 300 is connected.

The printed wiring board 100X has a signal conductor pattern 111, and a plurality of resonance portions 120X$_1$, 120X$_2$ and 120X$_3$ which are connected to the signal conductor pattern 111. The resonance portion 120X$_1$ is an LC series resonant circuit of which the resonance frequency becomes equal to the frequency of a first-order harmonic, so as to interrupt a first-order harmonic component of a noise which overlaps a digital signal that propagates through the signal conductor pattern 111. The resonance portion 120X$_2$ is an LC series resonant circuit of which the resonance frequency becomes equal to the frequency of a second-order harmonic, so as to interrupt a second-order harmonic component of a noise which overlaps a digital signal that propagates through the signal conductor pattern 111. The resonance portion 120X$_3$ is an LC series resonant circuit of which the resonance frequency becomes equal to the frequency of a third-order harmonic, so as to interrupt a third-order harmonic component of a noise which overlaps a digital signal that propagates through the signal conductor pattern 111.

The resonance portion 120X$_1$ has a sheet signal wiring 14 which opposes to the ground conductor pattern 121, and a via conductor 13 which connects the sheet signal wiring 14 with the signal conductor pattern 111. The resonance portion 120X$_2$ has a sheet signal wiring 16 which opposes to the ground conductor pattern 121, and a via conductor 15 which connects the sheet signal wiring 16 with the signal conductor pattern 111. The resonance portion 120X$_3$ has a sheet signal wiring 18 which opposes to the ground conductor pattern 121, and a via conductor 17 which connects the sheet signal wiring 18 with the signal conductor pattern 111.

When a capacitance formed by the sheet signal wiring 14 and the ground conductor pattern 121 is represented by C1 [F], and an opposition distance, in other words, an interlayer spacing between the sheet signal wiring 14 and the ground conductor pattern 121 is represented by t [m], and a relative permittivity of an insulating layer of the printed wiring board 100X is represented by ε$_γ$, an area S1 of the sheet signal wiring 14 is expressed by Expression 2.

[Math. 2]

$$S1 = \frac{C1 \times t}{\varepsilon_0 \times \varepsilon_r} \quad (2)$$

In addition, the capacitances corresponding to a second-order harmonic which becomes a frequency of twice of the first-order harmonic, and a third-order harmonic which becomes a frequency of three times of the first-order harmonic, are determined to be C2=C¼ and C3=C⅑, respectively, from Expression 1, and areas S2 and S3 of the sheet signal wirings 16 and 18 are expressed by Expression 3, respectively.

[Math. 3]

$$S2 = \frac{S1}{4}, \quad S3 = \frac{S1}{9}$$

The LC series resonant filter that is formed by the sheet signal wiring 14, the sheet signal wiring 16 and the sheet signal wiring 18 which are aligned needs to have an area of approximately 1.5×S1.

On the other hand, in the present first embodiment, the connecting conductor 142 works as an inductor. In addition, the sheet signal wiring 122 has a potential distribution in which a side of the conductor pattern 131 works as a node of potential fluctuation, and a side of the conductor pattern 133 works as an anti-node of potential fluctuation, at a resonance frequency which is equal to the first-order harmonic (frequency derived by multiplying, by 1, fundamental frequency of digital signal). An electric current in the same direction as an electric current which flows in the via conductor 123 flows in the inductor formed by the connecting conductor 142, due to the potential distribution in the sheet signal wiring 122, and the inductor resonates with the capacitor formed by the conductor pattern 133 and the ground conductor pattern 121. Similarly, resonance occurs also between the connecting conductor 141 and the conductor pattern 132.

By these resonances, a difference between a potential formed in the capacitor formed by the conductor pattern 133 and a potential formed in the capacitor formed by the conductor pattern 132 which is adjacent to the conductor pattern 133 becomes larger, and the capacitance of the capacitor formed by the conductor pattern 133 becomes apparently small. Similarly, the capacitance of the capacitor formed by the conductor pattern 132 becomes apparently small due to the difference between the potentials of the capacitors formed by the conductor pattern 132 and by the adjacent conductor pattern 131. Accordingly, a space R12 sandwiched between the conductor pattern 133 and the conductor pattern 132 becomes a state in which a capacitor exists that is connected with the conductor pattern 133 in parallel, and the state becomes equivalent to a state in which the conductor pattern is electrically embedded in the space R12. Similarly, a space R11 sandwiched between the conductor pattern 132 and the conductor pattern 131 also becomes equivalent to a state in which the conductor pattern is electrically embedded in the space R11. Specifically, an effect equivalent to the case is obtained where the capacitor is formed between a virtual conductor pattern having the same area as that of the surrounding area S1, and the ground conductor pattern 121 which opposes to the virtual conductor pattern.

In addition, at a resonance frequency which is equal to the second-order harmonic, the sheet signal wiring 122 has a potential distribution in which the conductor pattern 132 in the center works as an anti-node of potential fluctuation, and the conductor pattern 131 side and the conductor pattern 133 side work as a node of potential fluctuation. Incidentally, the second-order harmonic is a frequency derived by multiplying, by 2, the fundamental frequency of the digital signal. An electric current in the same direction as an electric current which flows in the via conductor 123 flows in the inductor formed by the connecting conductor 141, due to the potential distribution in the sheet signal wiring 122, and the inductor resonates with the capacitor formed by the conductor pattern 132. By this resonance, a capacitance becomes apparently small due to a difference between potentials of the capacitor formed by the conductor pattern 132 and the capacitor formed by the conductor pattern 131, and a space R11 sandwiched between the conductor pattern 132 and the conductor pattern 131 results in electrically working as a capacitor.

At the same time, an electric current in a reverse direction to the electric current flowing into the via conductor 123 flows in the inductor formed by the connecting conductor 142, and does not flow into an interruption circuit of the unnecessary high harmonic, which is connected to the signal conductor pattern 111. Furthermore, a self-resonance having no relationship with the interruption of the unnecessary high harmonic occurs in the sheet signal wiring 122, due to the capacitor formed by the conductor pattern 133, and capacitors formed by the conductor pattern 131, the conductor pattern 132 and a portion of the space R11 which is considered to be filled with a conductor.

Specifically, because of this self-resonance, an effective area of the sheet signal wiring 122, which is used for the series resonance of the resonance portion 120, becomes an area obtained by deducting the area of the conductor pattern 133 from the areas of the conductor patterns 131 and 132 and the region R11, specifically, becomes an area substantially equal to ¼ of the surrounding area S1. In other words, the sheet signal wiring 122 of the resonance portion 120 (LC series resonant circuit) which is connected to the signal conductor pattern 111 results in working while using only the conductor pattern 131 that is not affected by the self-resonance.

In addition, at the resonance frequency equal to the third-order harmonic (frequency derived by multiplying, by 3, fundamental frequency of digital signal), the sheet signal wiring 122 has nodes of potential fluctuation formed in the outside of the conductor pattern 131, in the outside of the conductor pattern 133, and in the center of the conductor pattern 132. The sheet signal wiring 122 has a potential distribution in which an anti-node of potential fluctuation is formed in the center between each of the nodes of potential fluctuation. However, the potential fluctuation is small which occurs in between the conductor pattern 133 and the conductor pattern 132 that are positioned distant from the via conductor 123, and does not exert an influence due to the resonance on the conductor pattern 132. Because of the potential distribution in the sheet signal wiring 122, an electric current in a reverse direction to the electric current flowing into the via conductor 123 flows in the inductor formed by the connecting conductor 141, and does not flow into an interruption circuit of the unnecessary high harmonic, which is connected to the signal conductor pattern 111. Furthermore, a self-resonance having no relationship with the interruption of the unnecessary high harmonic occurs in the capacitor formed by the conductor pattern 132 and one part of the capacitor formed by the conductor pattern 131.

Specifically, because of this self-resonance, an effective area of the sheet signal wiring 122, which is used for the series resonance of the resonance portion 120, becomes an area obtained by deducting the area of the conductor pattern 132 from the area of the conductor pattern 131, specifically, becomes an area substantially equal to ⅑ of the surrounding area S1. In other words, the sheet signal wiring 122 of the resonance portion 120 results in working while using ⁴⁄₉ of the conductor pattern 131 which is not affected by the self-resonance.

As has been described above, the resonance portion 120 works as an LC series resonant filter which can interrupt the first-order, second-order and third-order harmonics, specifically, components of frequencies derived by multiplying, by 1, 2 and 3, the fundamental frequency of the digital signal.

The area of the sheet signal wiring 122, specifically, the surrounding area S1 of the surrounding region Ra surrounded by a surrounding line La which surrounds the plurality of conductor patterns 131 to 133 becomes equivalent to the area S1 of the sheet signal wiring 14 in the comparative example. Accordingly, the surrounding area S1 can be reduced to the area of ⅔ of the total area of the sheet signal wirings 14, 16 and 18 in the comparative example.

Furthermore, the unnecessary high harmonics from the first-order to third-order harmonics can be interrupted by the resonance portion 120 formed of one set of the via conductor 123 and the sheet signal wiring 122, and it becomes easy to add the resonance portion in a substrate design. Specifically, as the exclusive region of the resonance portion 120 is reduced, the other wires are more easily arranged, and the miniaturization of the printed wiring board 100 also can be achieved.

Here, as is illustrated in FIG. 4B, the conductor pattern 131 is classified into a first region R1 at a side adjacent to the conductor pattern 132, and a second region R2 which is in an opposite side to the first region R1 and has an area of ⅑ of the surrounding area S1. The second region R2 is a portion which contributes to the series resonance of the resonance portion 120 with respect to the third-order harmonic component. Accordingly, the via conductor 123 can be connected to the second region R2 of the conductor pattern 131. Thereby, the via conductor 123 is not affected by the self-resonance at the third-order harmonic frequency, and can accurately interrupt the unnecessary high harmonic frequency.

In addition, a connection portion between the via conductor 123 and the conductor pattern 131 can exist on a straight line (on dashed line L1 in FIG. 4A) along a direction (direction of arrow Y) in which the connecting conductor 141 extends. Thereby, the unnecessary high harmonic frequency can be accurately interrupted.

Second Embodiment

Figure 5:
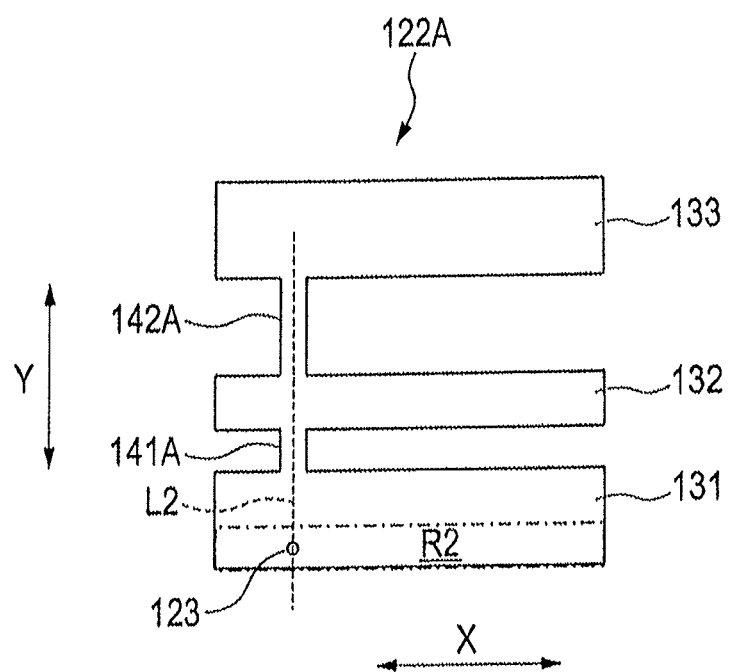
FIG. 5 is a plan view illustrating a sheet signal wiring of a printed wiring board in a printed circuit board according to a second embodiment.

Next, a printed circuit board according to a second embodiment of the present invention will be described. FIG. 5 is a plan view illustrating a sheet signal wiring of a printed wiring board in a printed circuit board according to the second embodiment of the present invention. Incidentally, in the present second embodiment, configurations other than the sheet signal wiring are similar to those in the above described first embodiment, and the description of the configurations other than the sheet signal wiring will be omitted.

As is illustrated in FIG. 5, a sheet signal wiring 122A has the plurality (three) of conductor patterns 131, 132 and 133, and connecting conductors 141A and 142A which connect these conductor patterns, similarly to that in the above described first embodiment. In the above described first embodiment, the connecting conductors 141 and 142 are arranged in the ends of the conductor patterns 131, 132 and 133 in the direction of the arrow X, but the arrangement is not limited to this. In the present second embodiment, the connecting conductors 141A and 142A are arranged at portions other than the ends.

These connecting conductors 141A and 142A are arranged on the same line (on dashed line L2 extending to direction of arrow Y in FIG. 5). In the conductor pattern 131, a connection portion of the via conductor 123 exists on a straight line (on dashed line L2) along a direction (direction of arrow Y) in which the connecting conductor 141A extends, similarly to that in the above described first embodiment. In addition, the via conductor 123 is connected to the second region R2 of the conductor pattern 131, similarly to that in the above described first embodiment. By the above configuration, the via conductor 123 can accurately interrupt the unnecessary high harmonic frequency, without being affected by the self-resonance at the third-order harmonic frequency.

The conductor pattern 132 and the conductor pattern 133 are set at a state of being divided into the two capacitors, in directions toward left and right ends from the portions at which the conductor patterns are connected to the connecting conductors 141A and 142A, respectively. Then, the connecting conductor 142A resonates with two capacitors of the conductor pattern 133, and the connecting conductor 141A resonates with two capacitors of the conductor pattern 132, respectively. In addition, the two capacitors of the conductor patterns similarly contribute also to the self-resonances which occur in between the conductor pattern 133 and the conductor pattern 132 that sandwich the connecting conductor 142A, and in between the conductor pattern 132 and the conductor pattern 131 that sandwich the connecting conductor 141A, respectively.

In the present second embodiment, a similar effect to that in the above described first embodiment is obtained, and besides, flexibility is enhanced for a connection position between the via conductor 123 and the sheet signal wiring 122A. Thereby, it becomes easy to design a high-density substrate.

Third Embodiment

Figure 6A:
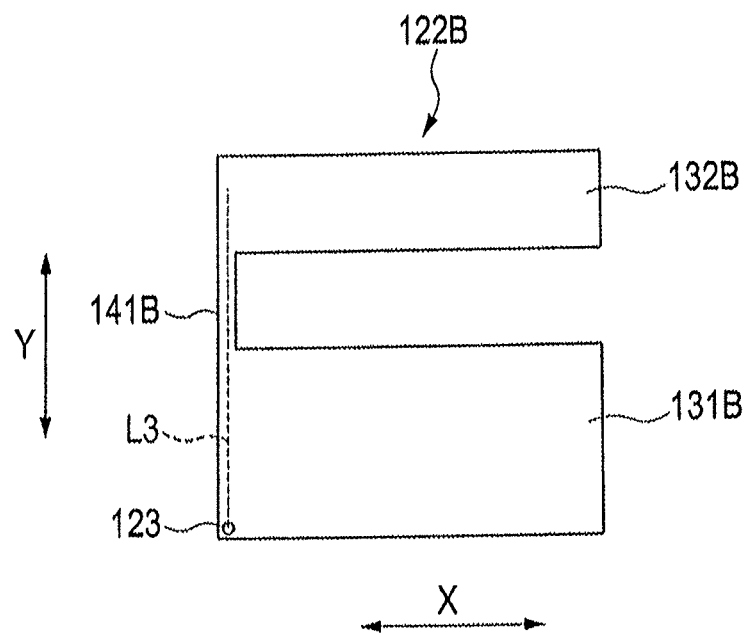
FIGS. 6A and 6B show explanatory views illustrating a sheet signal wiring of a printed wiring board in a printed circuit board according to a third embodiment.
Figure 6B:
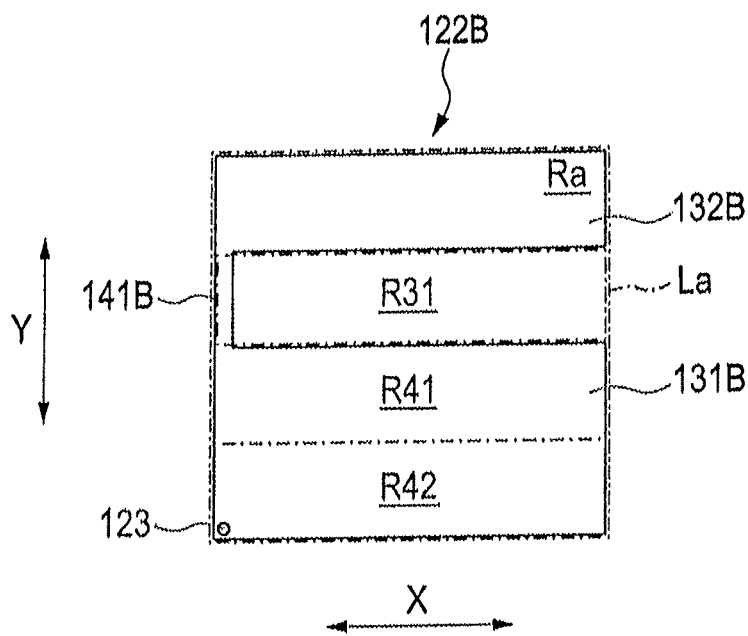

Next, a printed circuit board according to a third embodiment of the present invention will be described. FIGS. 6A and 6B show an explanatory view illustrating a sheet signal wiring of a printed wiring board in a printed circuit board according to the third embodiment of the present invention. In the above described first and second embodiments, the case has been described where the resonance portion is configured so as to interrupt the first, second and third harmonic components, but in the present third embodiment, the case will be described where the resonance portion is configured so as to interrupt the first and second harmonic components. Incidentally, in the present third embodiment, configurations other than the sheet signal wiring are similar to FIG. 1 and FIG. 2 described in the above described first embodiment, and in the present third embodiment, a sheet signal wiring 122B will be described as the sheet signal wiring corresponding to the sheet signal wiring 122 in FIG. 1 and FIG. 2.

FIG. 6A is a plan view of the sheet signal wiring 122B; and FIG. 6B is a plan view for describing a configuration of the sheet signal wiring 122B.

The sheet signal wiring 122B is configured so as to have a plurality (two) of conductor patterns 131B and 132B which are aligned while being separated from each other, and a connecting conductor 141B that connects the conductor patterns 131B and 132B to each other, which are adjacent to each other. The conductor patterns 131B and 132B are formed into a planer shape.

The conductor patterns 131B and 132B can be each formed into a rectangle shape. The conductor patterns 131B and 132B can be arranged along a width direction (direction of arrow Y) while being separated from each other, and can be formed so as to have the same length in a length direction (direction of arrow X) which is perpendicular to the width direction. The conductor patterns 131B and 132B can be parallel to each other, in other words, can have the same length direction as each other. In addition, a direction in which the connecting conductor 141B extends can be a direction which crosses the length direction of the conductor patterns 131B and 132B, and can be the direction perpendicular (direction of arrow Y) to the length direction in particular. The width of the connecting conductor 141B in the direction of the arrow X is shorter than the length of the conductor patterns 131B and 132B in the length direction (direction of arrow X).

In the present third embodiment, any of the two conductor patterns 131B and 132B is a conductor pattern which is positioned in the outside, and the conductor pattern 131B is determined to be a first conductor pattern. In addition, the conductor pattern 132B which is adjacent to the conductor pattern 131B is determined to a second conductor pattern.

In order that the via conductor 123 connects the conductor pattern 131B with the signal conductor pattern 111 (see FIG. 1), one end of the via conductor 123 is connected to the signal conductor pattern 111, and the other end is connected to the conductor pattern 131B.

In the present third embodiment, the connecting conductor 141B is a linear conductor (pattern) which is formed on the conductor layer 103 (see FIG. 2) integrally with the conductor patterns 131B and 132B. Incidentally, the connecting conductor 141B may be formed by a not-illustrated via conductor and a not-illustrated conductor pattern which is formed on a conductor layer different from the conductor layer 103. Anyway, the connecting conductor 141B may be formed separately from the signal conductor pattern 111.

A surrounding area (size) S1 of a surrounding region Ra which is surrounded by the shortest surrounding line La that surrounds the plurality of conductor patterns 131B and 132B is an area in which the resonance portion 120 resonates with a frequency derived by multiplying, by 1, the fundamental frequency of the digital signal. Specifically, the surrounding region Ra has a size with which the LC resonance circuit having the same resonance frequency as the first-order harmonic of the noise is formed from the capacitance that is produced by the conductor patterns 131B and 132B and the ground conductor pattern 121, which oppose to each other, and the inductance of the via conductor 123.

In the present third embodiment, an area of the conductor pattern 131B is substantially equal to ½ of the surrounding area S1, and an area of the conductor pattern 132B is substantially equal to ¼ of the surrounding area S1.

An area of a region (space) R31 between the conductor pattern 131B and the conductor pattern 132B in the surrounding region Ra is substantially equal to ¼ of the surrounding area S1.

In the present third embodiment, the connecting conductor 141B works as an inductor. In addition, the sheet signal wiring 122B has a potential distribution in which the outside of the conductor pattern 131B works as a node of potential fluctuation, and the outside of the conductor pattern 132B works as an anti-node of potential fluctuation, at a resonance frequency which is equal to the first-order harmonic (frequency derived by multiplying, by 1, fundamental frequency of digital signal). An electric current in the same direction as an electric current which flows in the via conductor 123 flows in the inductor formed by the connecting conductor 141B, due to the potential distribution in the sheet signal wiring 122B, and the inductor resonates with the capacitor formed by the conductor pattern 132B and the ground conductor pattern 121.

By these resonances, a difference between a potential formed in the capacitor formed by the conductor pattern 132B and a potential formed in the capacitor formed by the conductor pattern 131B becomes larger, and the capacitance of the capacitor formed by the conductor pattern 132B becomes apparently small. Accordingly, a space R31 sandwiched between the conductor pattern 131B and the conductor pattern 132B becomes a state in which a capacitor exists that is connected with the conductor pattern 132B in parallel, and the state becomes equivalent to a state in which the conductor pattern is electrically embedded in the space R31. Specifically, an effect equivalent to the case is obtained where the capacitor is formed between a virtual conductor pattern having the same area as that of the surrounding area S1, and the ground conductor pattern 121 which opposes to the virtual conductor pattern.

In addition, at a resonance frequency which is equal to the second-order harmonic, the sheet signal wiring 122B has a potential distribution in which the inside of the conductor pattern 131B, which is the center, works as an anti-node of potential fluctuation, and the outside of the conductor pattern 131B and the outside of the conductor pattern 132B each work as a node of potential fluctuation. By the potential distribution in the sheet signal wiring 122B, an electric current in a reverse direction to the electric current flowing into the via conductor 123 flows in the inductor formed by the connecting conductor 141B, and does not flow into an interruption circuit of the unnecessary high harmonic, which is connected to the signal conductor pattern 111. Furthermore, a self-resonance having no relationship with the interruption of the unnecessary high harmonic occurs in the capacitor formed by the conductor pattern 132B and a capacitor formed by one part of the conductor pattern 131B.

Specifically, because of this self-resonance, an effective area of the sheet signal wiring 122B, which is used for the series resonance of the resonance portion 120, becomes an area obtained by deducting the area of the conductor pattern 132B from the area of the conductor pattern 131B, specifically, becomes substantially equal to ¼ of the surrounding area S1. In other words, the sheet signal wiring 122B of the resonance portion 120 results in working while using ½ of the conductor pattern 131B which is not affected by the self-resonance.

As has been described above, the resonance portion 120 works as an LC series resonant filter which can interrupt the first-order and second-order harmonics, specifically, components of frequencies derived by multiplying, by 1 and 2, the fundamental frequency of the digital signal.

The area of the sheet signal wiring 122B, specifically, the surrounding area S1 of the surrounding region Ra surrounded by a surrounding line La which surrounds the plurality of conductor patterns 131B and 132B becomes equivalent to the area S1 of the sheet signal wiring 14 in the comparative example. Accordingly, the surrounding area S1 can be reduced to an area less than the total area of the sheet signal wirings 14 and 16 in the comparative example.

Furthermore, the unnecessary high harmonics from the first-order to the second-order harmonics can be interrupted by the resonance portion 120 formed of one set of the via conductor 123 and the sheet signal wiring 122B, and it becomes easy to add the resonance portion in a substrate design. Specifically, as the exclusive region of the resonance portion 120 is reduced, the other wires are more easily arranged, and the miniaturization of the printed wiring board also can be achieved.

Here, as is illustrated in FIG. 6B, the conductor pattern 131B is classified into a first region R41 at a side adjacent to the conductor pattern 132B, and a second region R42 which is in an opposite side to the first region R41 and has an area of ¼ of the surrounding area S1. The second region R42 is a portion which contributes to the series resonance of the resonance portion 120 with respect to the second-order harmonic component. Accordingly, the via conductor 123 can be connected to the second region R42 of the conductor pattern 131B. Thereby, the via conductor 123 is not affected by the self-resonance at the second-order harmonic frequency, and can accurately interrupt the unnecessary high harmonic frequency.

In addition, a connection portion between the via conductor 123 and the conductor pattern 131B can exist on a straight line (on dashed line L3 in FIG. 6A) along a direction (direction of arrow Y) in which the connecting conductor 141B extends. Thereby, the unnecessary high harmonic frequency can be accurately interrupted.

EXEMPLARY EMBODIMENTS

Exemplary Embodiment 1

The printed circuit board configuration in the first embodiment illustrated in FIG. 1 was subjected to three-dimensional electromagnetic field simulation, and the effect of the configuration was verified. The result will be described below. The printed wiring board 100 used for a simulation model had a contour of which the width was 100 [mm], the length was 100 [mm], and the thickness was 1.6 [mm]. A conductor having a width of 3 [mm], a length of 100 [mm] and a thickness of 0.035 [mm] was provided on the conductor layer 101 which was one surface layer, as the signal conductor pattern 111. The sheet signal wiring 122 having a width of 11 [mm], a length of 11 [mm] and a thickness of 0.035 [mm] was provided on the bottom layer, specifically, on the conductor layer 103 which was the other surface layer. Furthermore, the ground conductor pattern 121 having a width of 100 [mm], a length of 100 [mm] and a thickness of 0.035 [mm] was provided so as to oppose to the sheet signal wiring 122 while having an interlayer spacing of 200 [μm]. The structure was as above. FR4 (relative permittivity of 4.3) was used for the insulator (dielectric) of the insulating layers 105 and 106, and copper (electroconductivity of $5.8 \times 10^7$ [S/m]) was used for the conductor.

The semiconductor package 200 and the connector 400 were set between both ends of the signal conductor pattern 111 and the ground conductor pattern 121, respectively, as a port 1 and a port 2 of the S-parameter. The via conductor 123 having a diameter of 0.2 [mm] and a length of 1.6 [mm] was provided on the middle point of the signal conductor pattern 111, and was connected with the sheet signal wiring 122. In addition, in the sheet signal wiring 122, the conductor pattern 133 had a width of 2.75 [mm] and a length of 100 [mm], the conductor pattern 132 had a width of 1.5 [mm] and a length of 100 [mm], and the conductor pattern 131 had a width of 2.75 [mm] and a length of 100 [mm]. The connecting conductor 142 had a length of 2.75 [mm], and the connecting conductor 141 had a length of 1.25 [mm].

On this model, the width of the connecting conductor 142 of the sheet signal wiring 122 was changed from 0.2 [mm] to 0.6 [mm], and the width of the connecting conductor 141 was changed from 0.2 [mm] to 1.2 [mm]; and S21 of the S-parameter changing at this time was determined from the simulation. Incidentally, the S21 of the S-parameter indicates the transmission characteristics of the filter.

Figure 7:
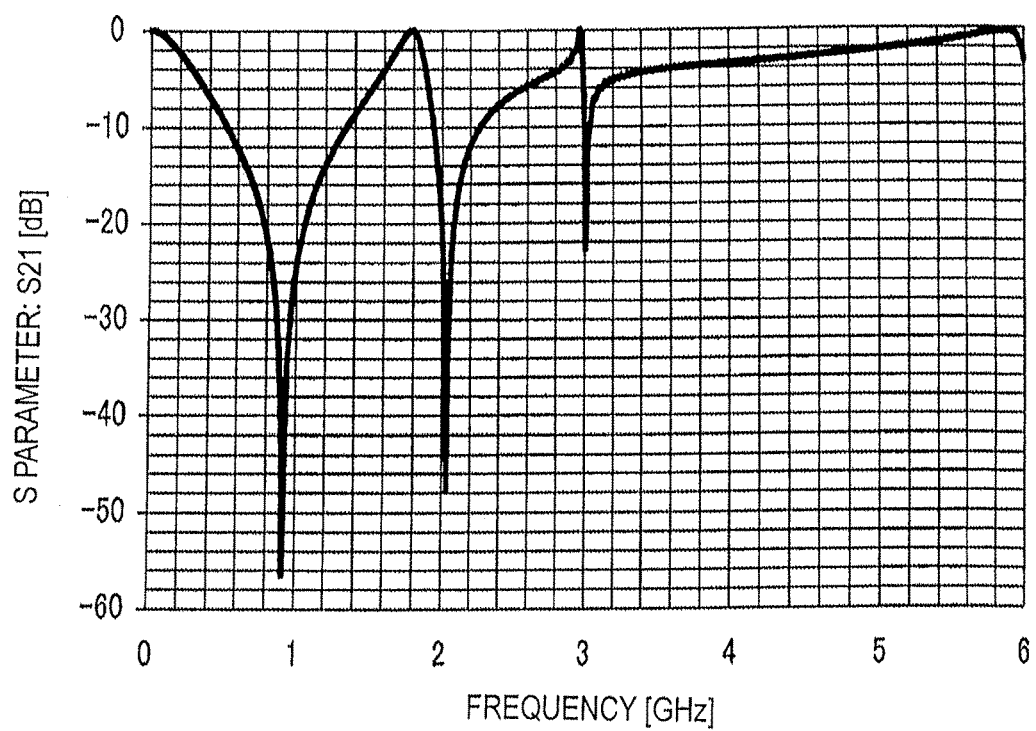
FIG. 7 is a graph illustrating a simulation result.

As one example, a simulation result obtained when the width of the connecting conductor 142 was 0.4 [mm], and the width of the connecting conductor 141 was 0.9 [mm] is illustrated in FIG. 7. It can be confirmed that the S21 of the S-parameter decreases, specifically, the noise is interrupted at 1 [GHz] which corresponds to the first-order harmonic, at 2 [GHz] which corresponds to the second-order harmonic, and at 3 [GHz] which corresponds to the third-order harmonic, due to the LC series resonance.

Firstly, at 1 [GHz] which corresponds to the first-order harmonic, even when the widths of the connecting conductor 142 and connecting conductor 141 are changed in the above described range, the S21 of approximately −25 [dB] is stably obtained.

Next, at 2 [GHz] which corresponds to the second-order harmonic, the interruption characteristics of the noise are not affected by the width of the connecting conductor 141 in the above described range, but can be obtained by the width of the connecting conductor 142.

Figure 8:
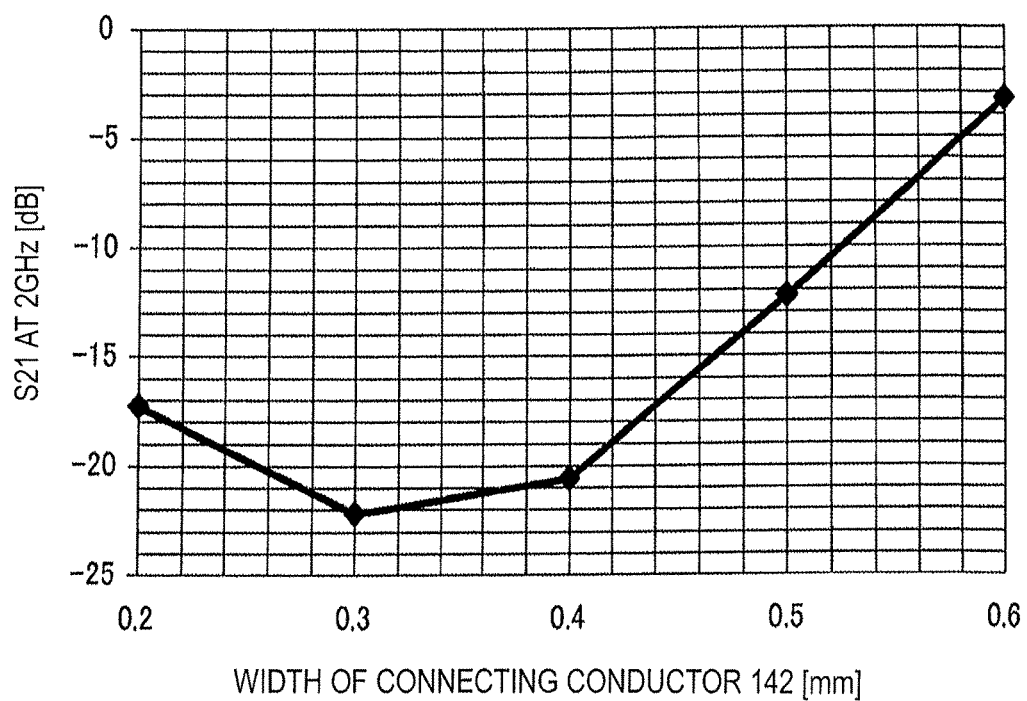
FIG. 8 is a graph illustrating a simulation result.

The characteristics of the S21 changing with the width of the connecting conductor 142 to be shown when the width of the connecting conductor 141 is set at 0.9 [mm] are illustrated in FIG. 8. It can be confirmed from this result that when the connecting conductor 142 is set at 0.5 [mm] or less, the noise of 2 [GHz] which corresponds to the second-order harmonic can be reduced by 10 [dB] or more. Furthermore, the influence of the width of the connecting conductor 142 is small at 3 [GHz] which corresponds to the third-order harmonic, when the width is 0.5 [mm] or less, and the interruption characteristics of the noise can be obtained due to the width of the connecting conductor 141.

Figure 9:
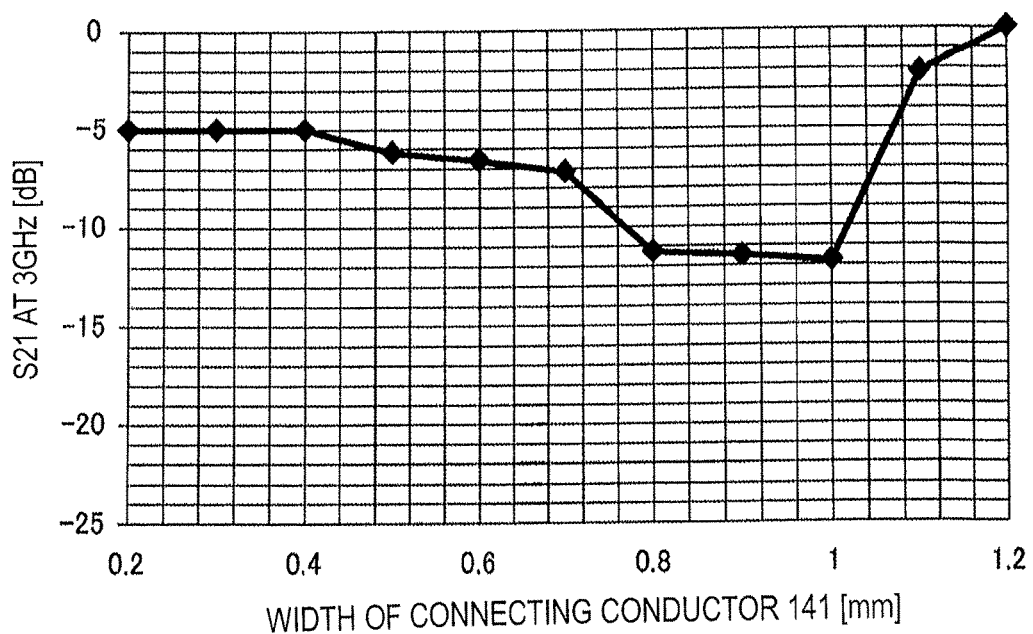
FIG. 9 is a graph illustrating a simulation result.

The characteristics of the S21 changing with the width of the connecting conductor 141 to be shown when the width of the connecting conductor 142 is set at 0.4 [mm] are illustrated in FIG. 9. It can be confirmed from this result that when the connecting conductor 141 is set at 0.8 [mm] to 1.0 [mm], the noise of 3 [GHz] which corresponds to the third-order harmonic can be reduced by 10 [dB] or more.

In addition, the interruption characteristics of the noise were confirmed for such a contour in the following Table 1 as to keep the area of the sheet signal wiring 122 constant.

TABLE 1

| | A | B | C | D | E |
|---|---|---|---|---|---|
| Longer direction of conductor pattern | 11 mm | 9.4 mm | 8.3 mm | 7.3 mm | 12.8 mm |
| Stacked direction of conductor pattern | 11 mm | 12.8 mm | 14.7 mm | 16.5 mm | 9.4 mm |

Table 1A is the above described example. The S21 of the S-parameter was determined from the simulation on other four states. The first-order and second-order harmonics showed a similar tendency to those in Table 1A, and it was confirmed that the noise interruption effect could be obtained as long as the connecting conductor 142 was set at 0.5 [mm] or less.

Figure 10:
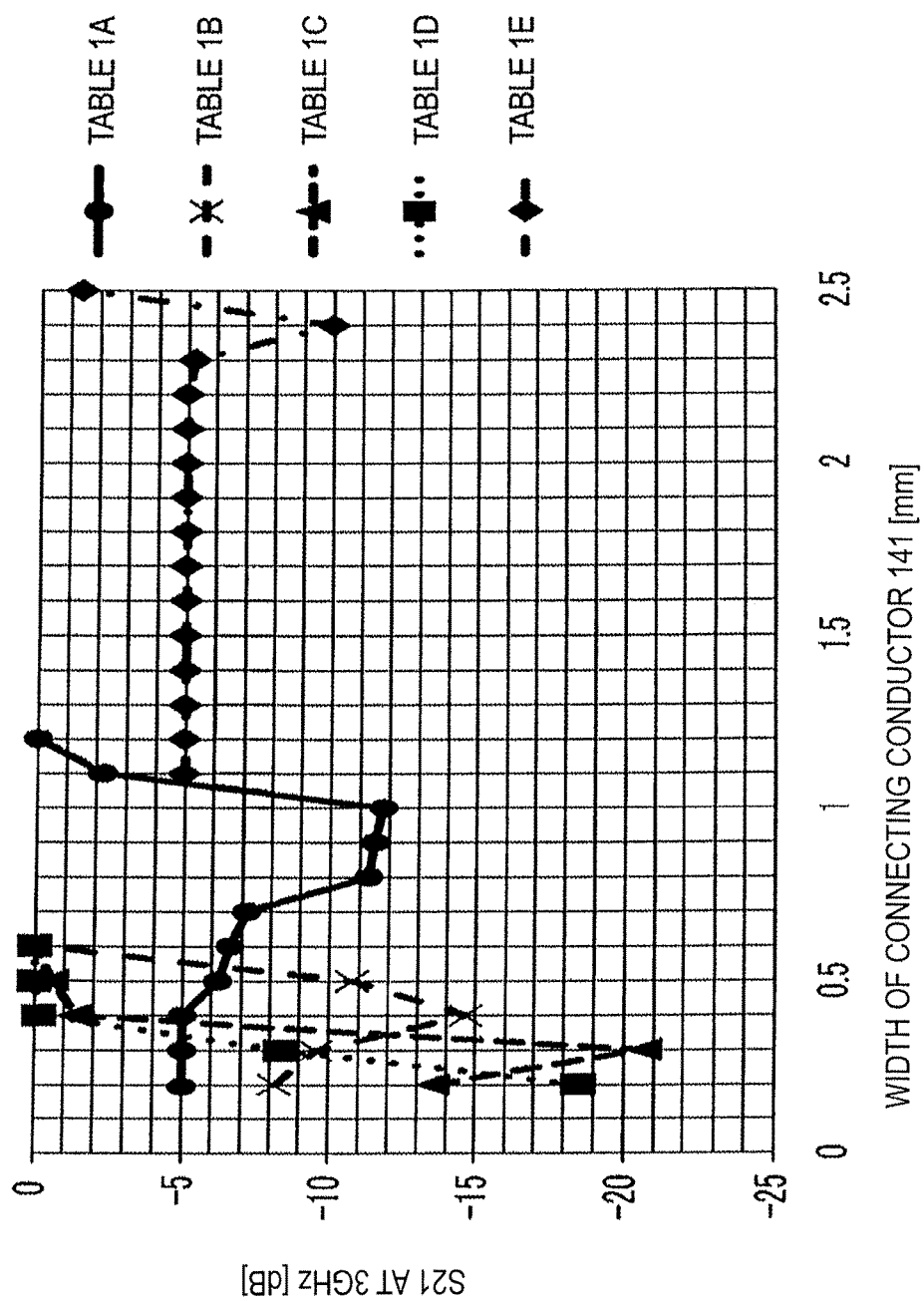
FIG. 10 is a graph illustrating a simulation result.

The characteristics of the S21 changing with the width of the connecting conductor 141 at 3 [GHz] which corresponds to the third-order harmonic are illustrated in FIG. 10, for each of the states shown in Table 1. When the lengths in a longer direction of the conductor patterns 131 and 132 are changed from the longest length in Table 1E to the shortest length in Table 1D, the capacitances of the capacitor formed by the conductor pattern 131 and the capacitor formed by the conductor pattern 132 decrease. It can be confirmed from the result that in order to obtain the noise reduction effect at 3 GHz in the interruption circuit of the unnecessary high harmonic connected to the signal conductor pattern 111, it is necessary to narrow the width along with the decrease of the capacitance so that the inductance of the connecting conductor 141 increases. On the contrary, when the length in the longer direction of the conductor pattern is lengthened to 12.8 [mm], the width of the connecting conductor 141 needs to be widened to 2.4 [mm], but the inductance of the connecting conductor 141 becomes considerably small. The noise reduction effect of 10 [dB] or more is obtained in a range not longer than this length in the longer direction.

Accordingly, it can be confirmed that 3 [GHz] which corresponds to the third-order harmonic can be reduced by 10 [dB] or more, when the lengths in the longer direction of the conductor patterns 131 and 132 are the length in Table 1D or longer, where the width of the connecting conductor 141 is 0.2 [mm] which is attainable. In addition, the width of the connecting conductor 141 is 0.2 [mm] to 0.3 [mm] in the state of Table 1C, and thereby it can be confirmed that 3 [GHz] which corresponds to the third-order harmonic can be reduced by 10 [dB] or more. In addition, the width of the connecting conductor 141 is 0.3 [mm] to 0.5 [mm] in the state of Table 1B, and thereby it can be confirmed that 3 [GHz] which corresponds to the third-order harmonic can be reduced by 10 [dB] or more. In addition, the width of the connecting conductor 141 is 2.4 [mm] in the state of Table 1E, and thereby it can be confirmed that 3 [GHz] which corresponds to the third-order harmonic can be reduced by 10 [dB] or more.

Exemplary Embodiment 2

The second embodiment of the present invention illustrated in FIG. 5 was subjected to a three-dimensional electromagnetic field simulation. The result will be described below. In the simulation model, a portion different from the model used in the above described Exemplary Embodiment 1 is positions at which connecting conductors 141A and 142A are arranged. In the present exemplary embodiment 2, the model was used in which the connecting conductor 142A was connected to positions 2 [mm] inside from each one end of the conductor pattern 133 and the conductor pattern 132, and the connecting conductor 141A is connected to positions 2 [mm] inside from each one end of the conductor pattern 132 and the conductor pattern 131.

On this model, the width of the connecting conductor 142A of the sheet signal wiring 122A was changed from 0.2 [mm] to 0.6 [mm], and the width of the connecting conductor 141A was changed from 0.2 [mm] to 0.6 [mm]; and S21 of the S-parameter changing at this time was determined from the simulation. Incidentally, the S21 of the S-parameter indicates the transmission characteristics of the filter.

Similarly to the above described exemplary embodiment 1, at 1 [GHz] which corresponds to the first-order harmonic, even when the widths of the connecting conductor 142A and connecting conductor 141A are changed in the above described range, the S21 of approximately −25 [dB] is stably obtained.

Also at 2 [GHz] which corresponds to the second-order harmonic, the interruption characteristics of the noise are not affected by the width of the connecting conductor 141A in the above described range, but can be obtained when the width of the connecting conductor 142A is 0.5 [mm] or less.

Figure 11:
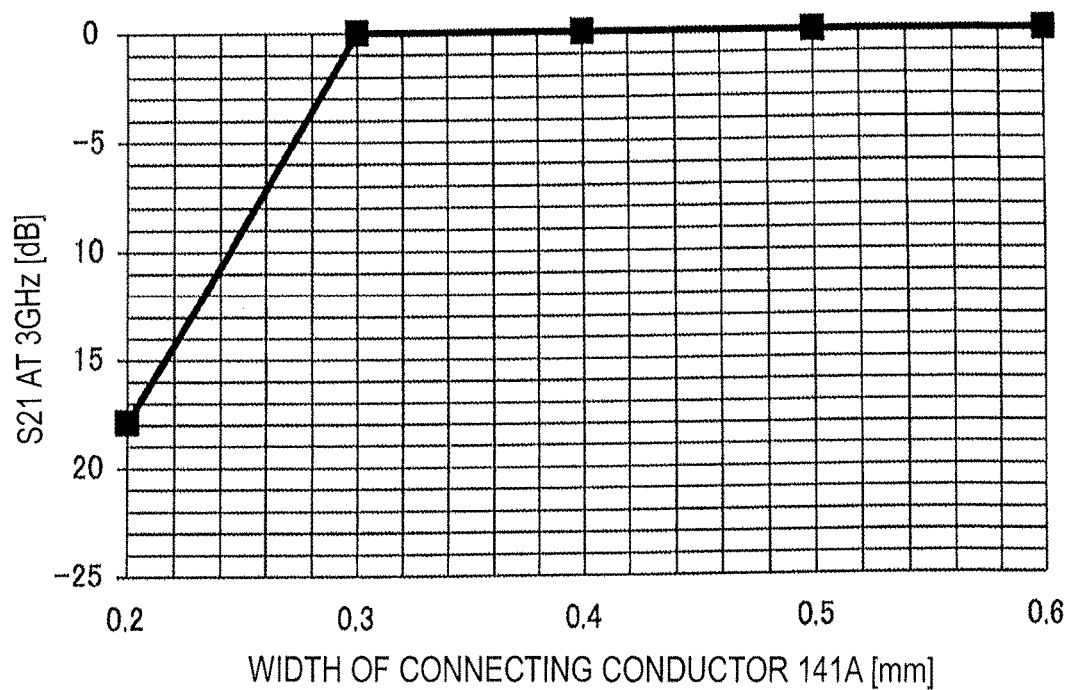
FIG. 11 is a graph illustrating a simulation result.

The influence of the width of the connecting conductor 142A is small at 3 [GHz] which corresponds to the third-order harmonic, when the width is 0.5 [mm] or less, and the interruption characteristics of the noise can be obtained due to the width of the connecting conductor 141A. The characteristics of the S21 changing with the width of the connecting conductor 141A to be shown when the width of the connecting conductor 142A is set at 0.4 [mm] are illustrated in FIG. 11. It can be confirmed from this result that when the connecting conductor 141A is set at 0.2 [mm], the noise of 3 [GHz] which corresponds to the third-order harmonic can be reduced by 10 [dB] or more.

The two capacitors formed by each of the conductor patterns are divided into right and left by connection portions between the connecting conductor 141A and each of the conductor pattern 132 and the conductor pattern 131, thereby the capacitance of the capacitor causes a change, and the change exerts a large influence on the self-resonance at 3 [GHz]. When the connecting conductor 141A is connected to the inside exceeding 2 [mm] from each of the ends of the conductor pattern 132 and the conductor pattern 131, the reduction effect of the noise at 3 [GHz] cannot be expected.

Figure 12:
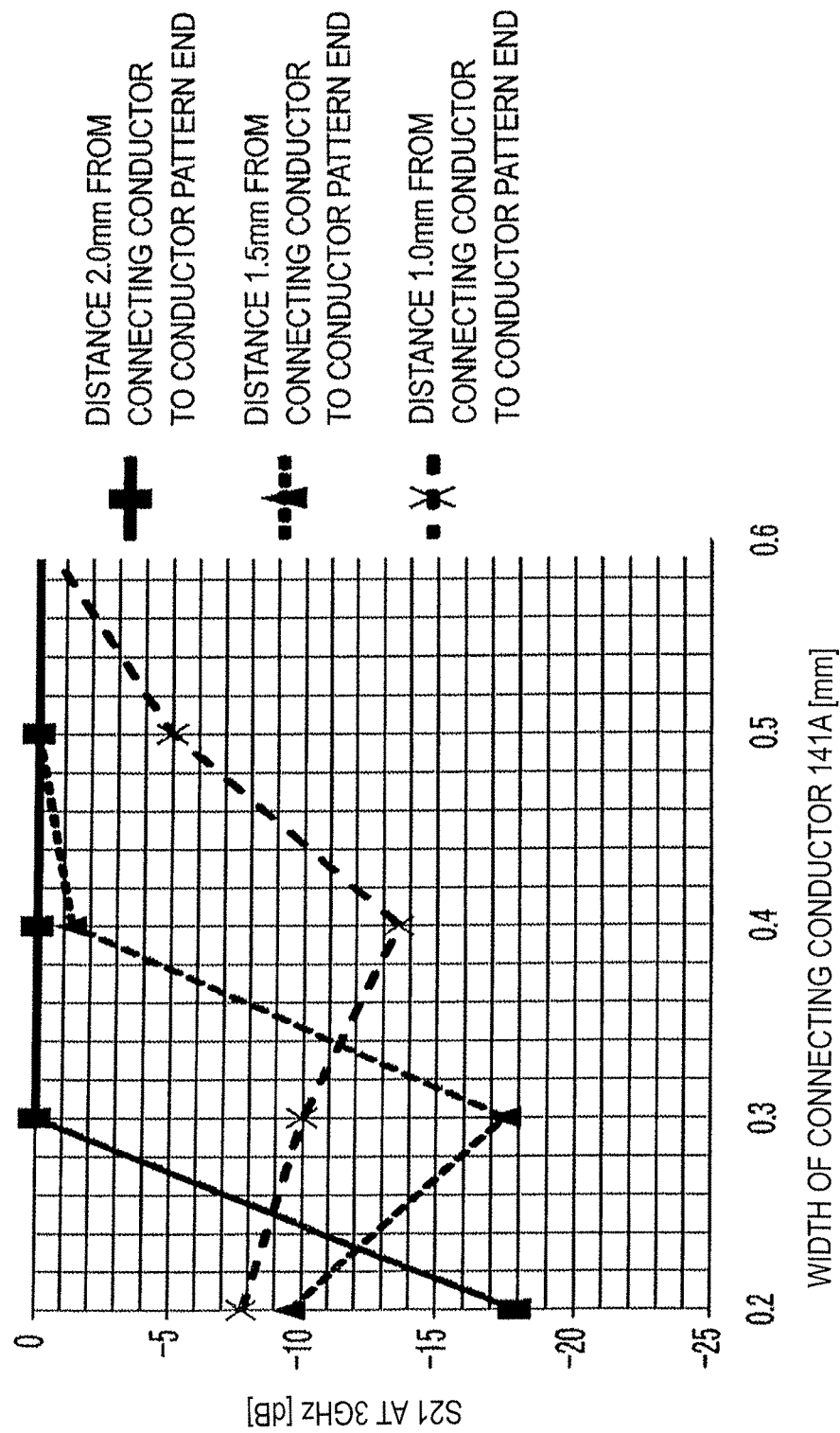
FIG. 12 is a graph illustrating a simulation result.

In addition, portions at which the connecting conductor 142A and the connecting conductor 141A are connected to each of the ends of the conductor pattern 133, the conductor pattern 132 and the conductor pattern 131 were set at 1.0 [mm] or 1.5 [mm], and the S21 of the S-parameter was confirmed by the simulation. The characteristics of the S21 changing with the width of the connecting conductor 141A at 3 [GHz] which corresponds to the third-order harmonic are illustrated in FIG. 12, for each of the above described states. From this result, it is confirmed that: the capacitance of the capacitor of the self-resonance increases by making the connecting conductor 141A move toward each of the ends of the conductor pattern 132 and the conductor pattern 131; and along with the increase, the width of the connecting conductor 141A needs to be thickened and the inductor thereof needs to be decreased.

Incidentally, the present invention is not limited to the embodiments described above, and can be variously modified within a technological idea of the present invention by those who have an ordinary knowledge in the field.

In the above described first and second embodiments, the case was described where the noises of the first-order to the third-order harmonic components were reduced, but the case is not limited to the above case. The resonance portion may be configured so as to reduce the noises of a fourth-order harmonic component and so on. Specifically, the resonance portion may be configured so as to reduce the frequency components derived by multiplying, by 4 or more, the fundamental frequency of the digital signal. In this case, the number of the conductor patterns in the resonance portion may be supposed to be n patterns when the frequency components derived by multiplying, by n or less (n is an integer of 2 or more), are reduced. Specifically, the number of the conductor patterns to be prepared may correspond to the number of an order of the harmonic component which is desired to be reduced. Even in this case, the area of the surrounding area S1 is at most the same area as that of the sheet signal wiring 14 of comparative example, which is similar to that in the first to third embodiments. Accordingly, an exclusive region of the resonance portion can be decreased.

In addition, in the above described first to third embodiments, the case was described where each of the conductor patterns has a rectangle shape, but the shape is not limited to the rectangle shape. The conductor pattern may have an arbitrary shape such as a trapezoidal shape, a triangular shape and a long circular shape.

In addition, in the above described first to third embodiments, the case was described where each of the resonance frequencies of the resonance portion is the frequencies of the integral multiples of the fundamental frequency of the digital signal, but the frequency is not limited to the frequencies, and the area of each of the conductor patterns may be appropriately adjusted according to the frequency band in which noises are generated.

In addition, in the above described first to third embodiments, the case was described where each of the resonance frequencies of the resonance portion is the frequencies of the integral multiples of the fundamental frequency of the digital signal, but each of the resonance frequencies may deviate from the frequencies of the integral multiples of the fundamental frequency within a range of an allowable tolerance within which a noise reduction effect is shown. Specifically, the case where each of the resonance frequencies of the resonance portion is the frequencies of the integral multiples of the fundamental frequency of the digital signal includes the case where the resonance frequencies deviate in the range of the allowable tolerance. Accordingly, the area of each of the conductor patterns with respect to the surrounding area S1 includes the case where the area deviates in the range of the allowable tolerance.

In addition, in the above described first to third embodiments, the case was described where the conductor layers of the printed wiring board were four layers, but the conductor layers may be three layers or more. In addition, the conductor pattern may be arranged on any conductor layer, and the ground conductor pattern also may be arranged on any conductor layer. In this case, the conductor pattern and the ground conductor pattern can be arranged on two conductor layers, respectively, which are adjacent to each other, while sandwiching an insulating layer therebetween so that the capacitance of the capacitor formed by these patterns becomes large.

In addition, in the above described first to third embodiments, the case was described where the semiconductor package transmits a differential signal as a digital signal by a differential transmission system, but the system is not limited to the differential transmission system. The present invention is applicable also to the case where the semiconductor package transmits a digital signal by a single-end system.

The printed circuit board according to the present invention can reduce an exclusive region for the resonance portion which can interrupt a plurality of harmonic components, and can reduce EMI originating in the digital signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-137013, filed Jun. 28, 2013, which is hereby incorporated by reference herein in its entirety.

The invention claimed is:

1. A printed circuit board comprising:
   a transmitting circuit having a signal terminal for transmitting a digital signal and a ground terminal to which a ground voltage is applied; and
   a printed wiring board on which the transmitting circuit is mounted, and which has at least three conductor layers stacked via insulating layers, wherein the three conductor layers are a first conductor layer, a second conductor layer and a third conductor layer,
   wherein the printed wiring board comprises:
     a first signal conductor pattern formed in the first conductor layer, and connected to the signal terminal of the transmitting circuit;
     a resonance portion which comprises:
       a ground conductor pattern formed in the second conductor layer, and connected to the ground terminal of the transmitting circuit;
       a second signal conductor pattern having two conductor patterns including a first conductor pattern and a second conductor pattern, and a connecting conductor connecting between the two conductor patterns, formed in the third conductor layer and arranged in opposition to the ground conductor pattern in the second conductor layer; and a via conductor connecting the second signal conductor pattern to the first signal conductor pattern, wherein a surrounding area formed by surrounding the two conductor patterns by a shortest surrounding line is substantially the same as an area of the resonance portion resonating with the fundamental frequency of the digital signal, wherein an area of the first conductor pattern is substantially equal to ½ of the surrounding area, and an area of the second conductor pattern is substantially equal to ¼ of the surrounding area, and wherein an area between the first conductor pattern and the second conductor pattern within the surrounding area is substantially ¼ of the surrounding area.

2. The printed circuit board according to claim 1, wherein the first conductor pattern is classified into a first area at a side adjacent to the second conductor pattern and a second area at a side opposite to the first area, the second area is substantially ¼ of the surrounding area, and the via conductor is connected to the second area of the first conductor pattern.

3. The printed circuit board according to claim 1, wherein the surrounding area is formed into a rectangle shape, and each of the two conductor patterns is formed into a rectangle shape.

4. The printed circuit board according to claim 3, wherein the connecting conductor is a linear conductor formed in the third conductor layer.

5. The printed circuit board according to claim 4, wherein a portion connecting the via conductor to the first conductor pattern is arranged on a straight line along a direction extending the connecting conductor.

6. The printed circuit board according to claim 2, wherein the via conductor connects a width direction end of the second area to the signal conductor pattern.

7. A printed circuit board comprising:
a transmitting circuit having a signal terminal for transmitting a digital signal and a ground terminal to which a ground voltage is applied; and
a printed wiring board on which the transmitting circuit is mounted, and which has at least three conductor layers stacked via insulating layers, wherein the three conductor layers are a first conductor layer, a second conductor layer and a third conductor layer,
wherein the printed wiring board comprises:
a first signal conductor pattern formed in the first conductor layer, and connected to the signal terminal of the transmitting circuit; and
a resonance portion which comprises:
a ground conductor pattern formed in the second conductor layer, and connected to the ground terminal of the transmitting circuit;
a second signal conductor pattern having three conductor patterns, wherein the three conductor patterns are a first conductor pattern, a second conductor pattern and a third conductor pattern, and having two connecting conductors connecting between adjacent two conductor patterns among the three conductor patterns, formed in a third conductor layer and arranged in opposition to the second conductor layer,
wherein a surrounding area formed by surrounding the three conductor patterns by a shortest surrounding line is substantially the same as an area of the resonance portion resonating with the fundamental frequency of the digital signal,
wherein the third conductor pattern is adjacent to the second conductor pattern, the area of the first conductor pattern is substantially equal to ¼ of the surrounding area, the area of the second conductor pattern is substantially equal to 5/36 of the surrounding area and an area of the third conductor pattern is substantially equal to ¼ of the surrounding area, and
wherein an area between the first conductor pattern and the second conductor pattern within the surrounding area is substantially ⅑ of the surrounding area, and an area between the second conductor pattern and the third conductor pattern within the surrounding area is substantially ¼ of the surrounding area.

8. The printed circuit board according to claim 7, wherein the first conductor pattern is classified into a first area at a side adjacent to the second conductor pattern and a second area at a side opposite to the first area, the second area is substantially ⅑ of the surrounding area.

9. The printed circuit board according to claim 7, wherein the surrounding area is formed into a rectangle shape, and each of the three conductor patterns is formed into a rectangle shape.

10. The printed circuit board according to claim 9, wherein the connecting conductor is a linear conductor formed in the third conductor layer.

11. The printed circuit board according to claim 10, wherein a portion connecting the via conductor to the first conductor pattern is arranged on a straight line along a direction extending the connecting conductor.

12. The printed circuit board according to claim 8, wherein the via conductor connects a width direction end of the second area to the signal conductor pattern.

* * * * *